United States Patent
Neidengard et al.

(10) Patent No.: US 9,698,764 B2
(45) Date of Patent: Jul. 4, 2017

(54) QUADRATURE DIVIDER

(71) Applicants: Mark L. Neidengard, Beaverton, OR (US); Qi Wang, Portland, OR (US)

(72) Inventors: Mark L. Neidengard, Beaverton, OR (US); Qi Wang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/127,954

(22) PCT Filed: Sep. 18, 2013

(86) PCT No.: PCT/US2013/060419
§ 371 (c)(1),
(2) Date: Dec. 19, 2013

(87) PCT Pub. No.: WO2015/041645
PCT Pub. Date: Mar. 26, 2015

(65) Prior Publication Data
US 2016/0285436 A1    Sep. 29, 2016

(51) Int. Cl.
*H03K 3/037* (2006.01)
*H03K 5/15* (2006.01)
*H03K 23/58* (2006.01)

(52) U.S. Cl.
CPC .............. *H03K 3/037* (2013.01); *H03K 5/15* (2013.01); *H03K 23/588* (2013.01)

(58) Field of Classification Search
CPC ......... H03K 3/037; H03K 5/15; H03K 23/588
USPC ................................. 377/47, 48; 326/93–98
See application file for complete search history.

(56) References Cited

U.S. PATENT DOCUMENTS

| | | | |
|---|---|---|---|
| 5,587,709 A * | 12/1996 | Jeong | H03K 19/018592 341/100 |
| 5,592,126 A | 1/1997 | Boudewijns et al. | |
| 6,396,312 B1 | 5/2002 | Shepston et al. | |
| 7,002,325 B2 | 2/2006 | Harris et al. | |
| 7,113,048 B2 | 9/2006 | Brown et al. | |
| 7,414,489 B2 | 8/2008 | Dally et al. | |
| 7,477,112 B1 | 1/2009 | Pi et al. | |
| 7,733,129 B2 * | 6/2010 | Chang | G06F 1/04 326/93 |
| 8,004,335 B2 * | 8/2011 | Kim | H03B 27/00 327/231 |

(Continued)

OTHER PUBLICATIONS

U.S. Appl. No. 13/330,648, filed Dec. 19, 2011.

(Continued)

*Primary Examiner* — Brandon S Cole
(74) *Attorney, Agent, or Firm* — Blakely, Sokoloff, Taylor & Zafman LLP (57) ABSTRACT

Described is an apparatus of a quadrature divider. The apparatus is independent of a jam latch, and is for generating a quadrature clock. The apparatus comprises: a first selection unit controllable by a clock signal, the first selection unit to directly or indirectly generate a first phase of the quadrature clock; a third selection unit controllable by the clock signal, the third selection unit to receive the first phase of the quadrature clock, the third selection unit to directly or indirectly generate a third phase of the quadrature clock, wherein the first selection unit to receive the third phase of the quadrature clock.

12 Claims, 10 Drawing Sheets

(56) References Cited

U.S. PATENT DOCUMENTS

| | | | | |
|---|---|---|---|---|
| 8,013,654 | B1* | 9/2011 | Chen | G06F 1/06 327/261 |
| 8,174,300 | B2* | 5/2012 | Chen | G06F 1/06 327/261 |
| 2001/0052803 | A1 | 12/2001 | Ozawa | |
| 2002/0105386 | A1* | 8/2002 | Shastri | H03L 7/07 331/11 |
| 2005/0264337 | A1* | 12/2005 | Berkram | G06F 1/06 327/291 |
| 2006/0103478 | A1 | 5/2006 | Brown et al. | |
| 2006/0156049 | A1 | 7/2006 | Helio | |
| 2007/0090867 | A1 | 4/2007 | Kim | |
| 2008/0018367 | A1 | 1/2008 | Bazes | |
| 2008/0284476 | A1 | 11/2008 | Kwan et al. | |
| 2009/0128198 | A1 | 5/2009 | Badets et al. | |
| 2013/0154691 | A1* | 6/2013 | Li | G06F 1/06 327/117 |
| 2015/0295665 | A1* | 10/2015 | Ma | H04L 7/033 370/484 |
| 2016/0277219 | A1* | 9/2016 | Venkatram | H04L 7/033 |
| 2016/0290790 | A1* | 10/2016 | Wu | G01B 11/22 |

OTHER PUBLICATIONS

Non-Final Office Action issued for U.S. Appl. No. 13/619,090, mailed Dec. 4, 2013, 14 pages.

Li, S., et al., "Clock Generation for a 32nm Server Processor with Scalable Cores", *IEEE International Solid-State Circuits Conference*, Feb. 21, 2011. 2 pages.

PCT/US2013/060419 Notification of Transmittal of the International Search Report and the Written Opinion of the International Searching Authority, or the Declaration, mailed May 29, 2014, 11 pages.

Office Action from Related U.S. Appl. No. 13/619,090, mailed Apr. 7, 2014, 7 pages.

Notification Concerning Transmittal of International Preliminary Report on Patentability of the International Searching Authority issued for International Patent Application No. PCT/US2013/060419, mailed Mar. 31, 2016.

* cited by examiner

QUADRATURE DIVIDER

CLAIM OF PRIORITY

This application claims the benefit of priority of International Patent Application No. PCT/US2013/060419 filed Sep. 18, 2013, titled "QUADRATURE DIVIDER," which is incorporated by reference in its entirety.

BACKGROUND

Full-quadrature clocks are a common feature of modern I/O (input-output) systems. For example, full-quadrature clocks are used in PCI Express (Peripheral Component Interconnect Express) interfaces. Existing circuits for generating full-quadrature clocks consume excessive power, area, and have limited high frequency operating bandwidth.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
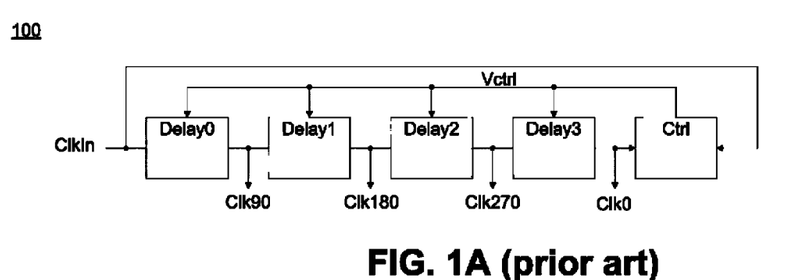
FIG. 1A illustrates a delay locked loop (DLL) for generating quadrature clock.

FIG. 1A illustrates a delay locked loop (DLL) 100 for generating quadrature clocks. In this example, DLL 100 consists of four delay cells—Delay0, Delay1, Delay2, and Delay3—and a control block Ctrl for generating control signals (in this example, an analog voltage Vctrl) for the delay cells. Input clock ClkIn is received by the control block and the first delay cell Delay0. Output of each delay cell is one of the quadrature clocks—Clk90, Clk180, Clk270, Clk0, where Clk0 is the reference phase, Clk90 has phase which is 90 degrees separate from the reference phase of Clk0, Clk180 has a phase which is 180 degrees separate from the reference phase of Clk0, and Clk270 has a phase which is 270 degrees separate from the reference phase of Clk0.

These clock phases may be used for sampling data (represented as eyes) received over a transmission media. For example, rising edges on Clk0 and Clk180 begin the even and odd data eyes, and rising edges on Clk90 and Clk270 provide sampling points in the middle of those eyes. However, DLL 100 consumes high power and area to generate quadrature clock relative to other digital circuits that may consume less power. Additionally, generating analog control voltage Vctrl uses analog circuits which traditionally consume more power than digital circuits.

Figure 1B:
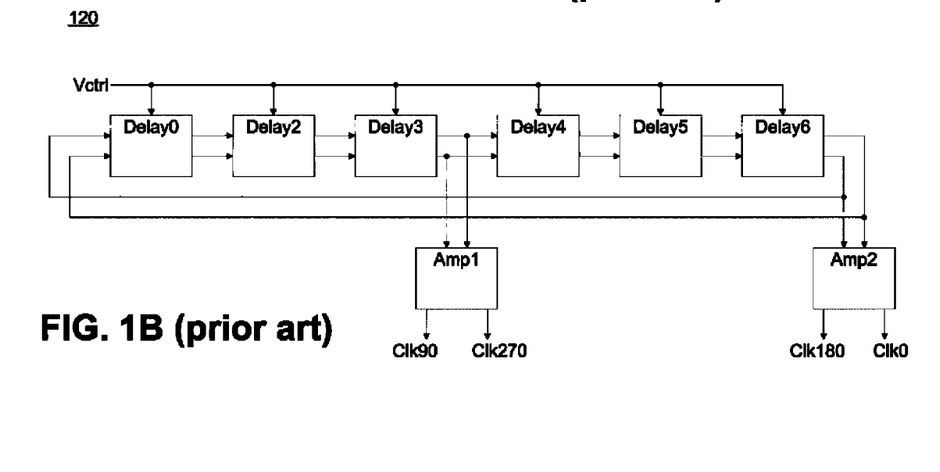
FIG. 1B illustrates a voltage controlled oscillator (VCO) for generating quadrature clock.

FIG. 1B illustrates a voltage controlled oscillator (VCO) 120 for generating quadrature clocks. VCO 120 consists of a plurality of delay cells. In this example, VCO 120 consists of an even number of differential delay cells coupled together in a ring topology. For example, differential delay cell Delay0 is coupled to differential delay cell Delay2, which is coupled to differential delay cell Delay3, which is coupled to differential delay cell Delay4, which is coupled to differential delay cell Delay5, which is coupled to differential delay cell Delay6 which is coupled back to differential delay cell Delay0.

In this example, quadrature clock is generated using second post VCO amplifiers, Amp1 and Amp2. Here, Amp1 is coupled to output of differential delay cell Delay3 while Amp2 is coupled to output of differential delay cell Delay6. In this example, Amp1 generates Clk90 and Clk270 while Amp2 generates Clk180 and Clk0. Here, VCO duty cycle will impact quadrature quality. Unfortunately, low noise VCOs may often need to be run faster than "full" speed, especially LC-based VCOs whose area requirements are inversely proportional to frequency. This requires a post-VCO divider capable of frequencies much higher than standard core logic would tolerate. Here, each delay differential delay cell is controlled by an analog voltage Vctrl generated by an analog circuit, which consumes more power than traditional digital circuits. For low power devices and for high frequency usage, VCO 120 based quadrature architecture becomes challenging.

Figure 2A:
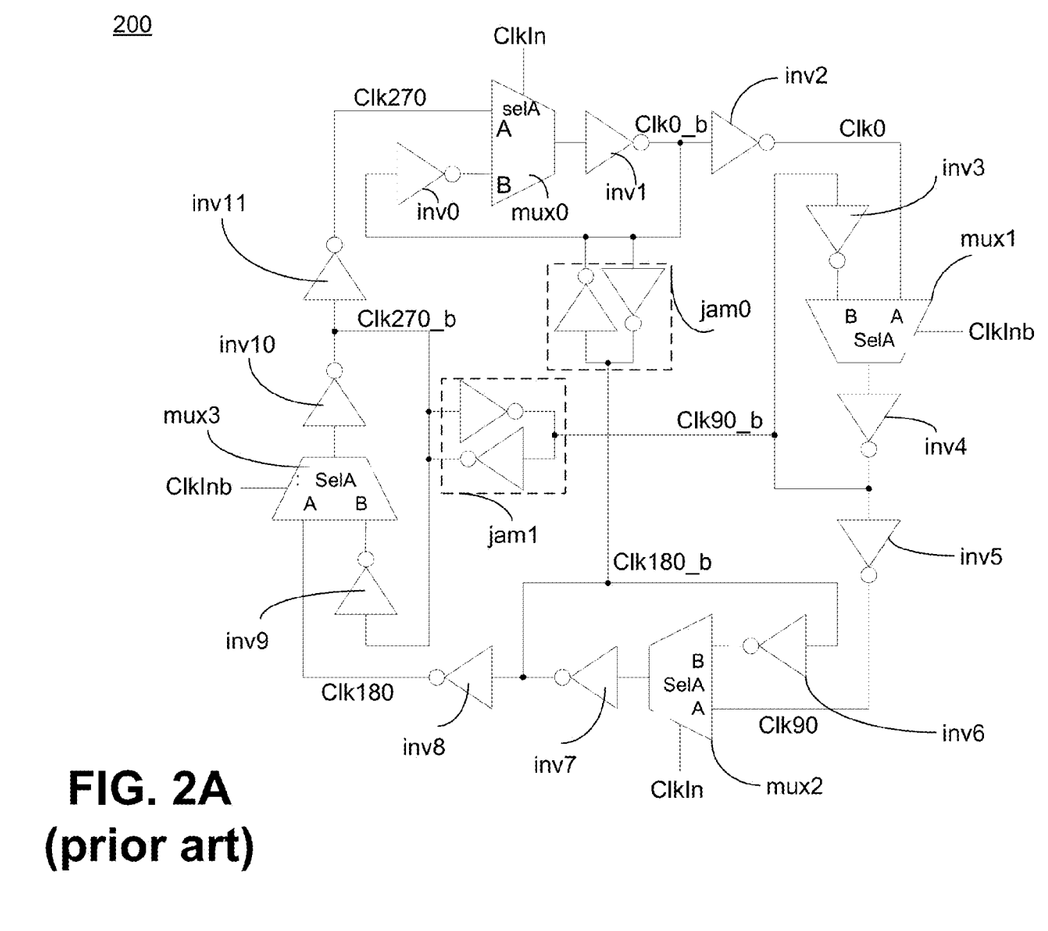
FIG. 2A illustrates a jam-latch based circuit quadrature clock generator.

FIG. 2A illustrates a jam-latch based circuit quadrature clock generator 200 (or quadrature divider 200). In this example, generator 200 consists of a ring of latches that receive clock and clock bar (ClkIn and Clkinb respectively) signals as inputs to multiplexers (Muxs). Clkinb signal is inverse of ClkIn signal. In this example, four latches and two jam-latch circuits (i.e., jam0 and jam1) are used. Output of each latch is used to generate a phase of the quadrature clock. The four phases of quadrature clock are Clk0, Clk90, Clk180, and Clk270, where Clk0_b, Clk90_b, Clk180_b, Clk270_b signals are inverse of clock signals Clk0, Clk90, Clk180, and Clk270 respectively. In the following description, the term node and signals on that node may use the same name. For example, Clk0 may refer to node Clk0 or Clk0 signal depending on the context of the sentence.

The first latch comprises mux0, inverter inv0, and inverter inv1. Mux0 is a two input multiplexer mux0 with input A coupled to an output of a previous latch and a second input B coupled to an output of mux0 via inverters inv0 and inv1. Here, inv0 and inv1 are coupled together such that inv1 receives output of mux0 and generates Clk0_b output which is received as input by inv0, output of which is provided as input B to mux0. In this example, output of previous latch is Clk270. Output Clk0_b is inverted by inverter inv2 to generate Clk0. Clk0 forms the reference phase of quadrature clock. Mux0 is controlled by select input SelA. In this example, SelA receives ClkIn signal.

The second latch comprises mux1, inverter inv3, and inverter inv4. Mux1 is a two input multiplexer mux1 with input A coupled to an output of a previous latch and a second input B coupled to an output of mux1 via inverters inv3 and inv4. Here, inv3 and inv4 are coupled together such that inv4 receives output of mux1 and generates Clk90_b output which is received as input by inv3, output of which is provided as input B to mux1. In this example, output of previous latch is Clk0. Output Clk90_b is inverted by inverter inv5 to generate Clk90. Clk90 forms phase signal which is 90 degrees relative to the reference phase Clk0 of quadrature clock. Mux1 is controlled by select input SelA. In this example, SelA receives ClkInb signal.

The third latch comprises mux2, inverter inv6, and inverter inv7. Mux2 is a two input multiplexer mux2 with input A coupled to an output of a previous latch and a second input B coupled to an output of mux2 via inverters inv6 and inv7. Here, inv6 and inv7 are coupled together such that inv7 receives output of mux2 and generates Clk180_b output which is received as input by inv6, output of which is provided as input B to mux2. In this example, output of previous latch is Clk90. Output Clk180_b is inverted by inverter inv7 to generate Clk180. Clk180 forms phase signal which is 180 degrees relative to the reference phase Clk0 of quadrature clock. Mux2 is controlled by select input SelA. In this example, SelA receives ClkIn signal.

The fourth latch comprises mux3, inverter inv9, and inverter inv10. Mux3 is a two input multiplexer mux3 with input A coupled to an output of a previous latch and a second input B coupled to an output of mux3 via inverters inv9 and inv10. Here, inv9 and inv10 are coupled together such that inv10 receives output of mux3 and generates Clk270_b output which is received as input by inv9, output of which is provided as input B to mux3. In this example, output of previous latch is Clk180. Output Clk270_b is inverted by inverter inv10 to generate Clk270. Clk270 forms phase signal which is 270 degrees relative to the reference phase Clk0 of quadrature clock. Mux3 is controlled by select input SelA. In this example, SelA receives ClkInb signal.

Jam0, which includes two cross-coupled inverters, is coupled to Clk0_b and Clk180_b. Jam1, which includes two cross-coupled inverters, is coupled to Clk90_b and Clk270_b. Jam0 and Jam1 may exhibit poor frequency scaling because of their contention based deign. Writing into the jam latches i.e., jam0 and jam1, consumes power to ensure that the cross-coupled inverters in each jam latch output different logical levels.

Figure 2B:
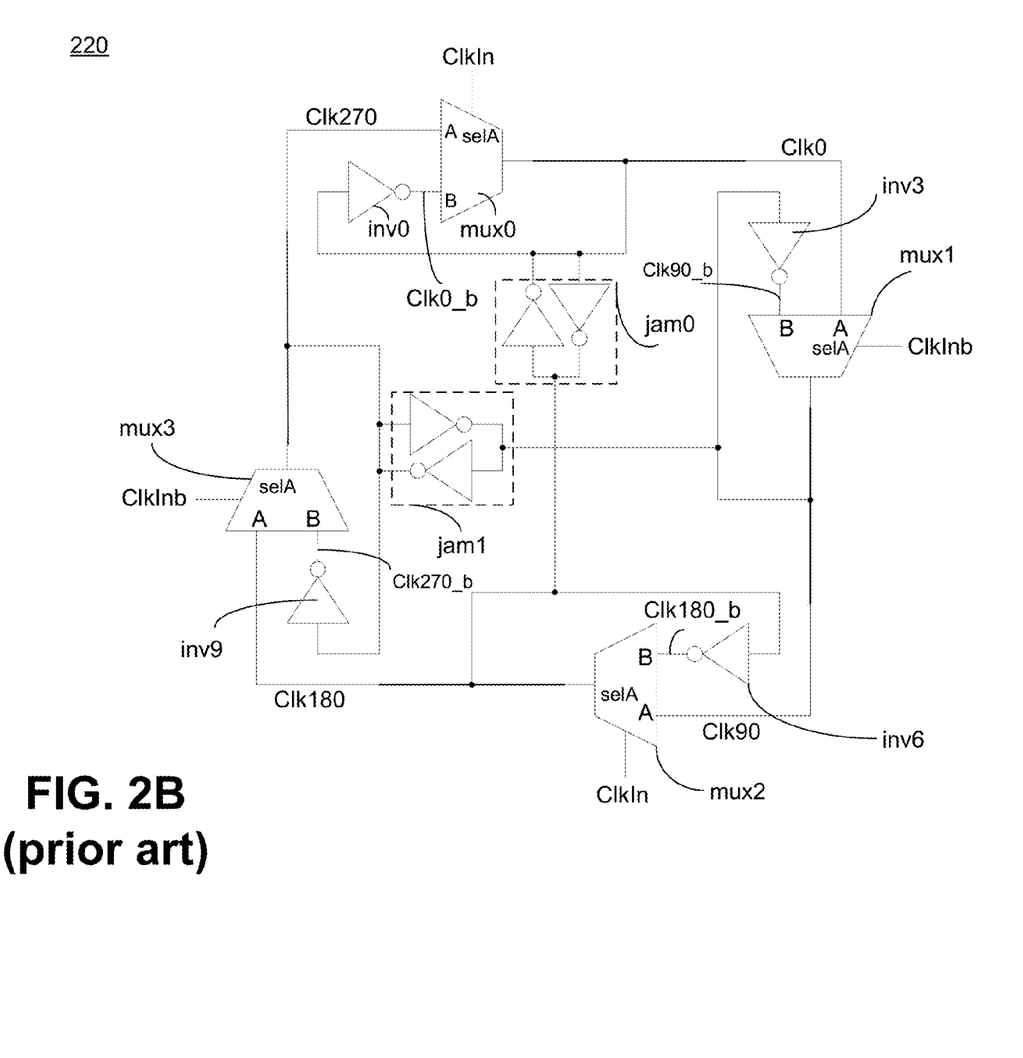
FIG. 2B illustrates another jam-latch based circuit quadrature clock generator.

FIG. 2B illustrates another jam-latch based circuit quadrature clock generator 220 (or quadrature divider 220). FIG. 2B is similar to FIG. 2A except that inverters driving between multiplexers are removed. For example, inv1 and inv2 are removed between mux0 and mux1, inv4 and inv5 are removed between mux1 and mux2, inv7 and inv8 are removed between mux2 and mux3, inv10 and inv11 are removed between mux3 and mux0.

The embodiments enhance frequency bandwidth of the ring-latch design of FIG. 2 by removing the jam latches jam0 and jam1. The embodiments further couple the inverted output of each latch i.e., first, second, third, and fourth latches, to input B of multiplexer of another latch. One technical effect of the embodiments is that the quadrature clock generator is about 25% faster than the quadrature generator of FIG. 2B i.e., the frequency bandwidth is much larger than the bandwidth of quadrature generator of FIG. 2B. The above technical effect is not a limiting technical effect. Other technical effects will be evident from the embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 3:
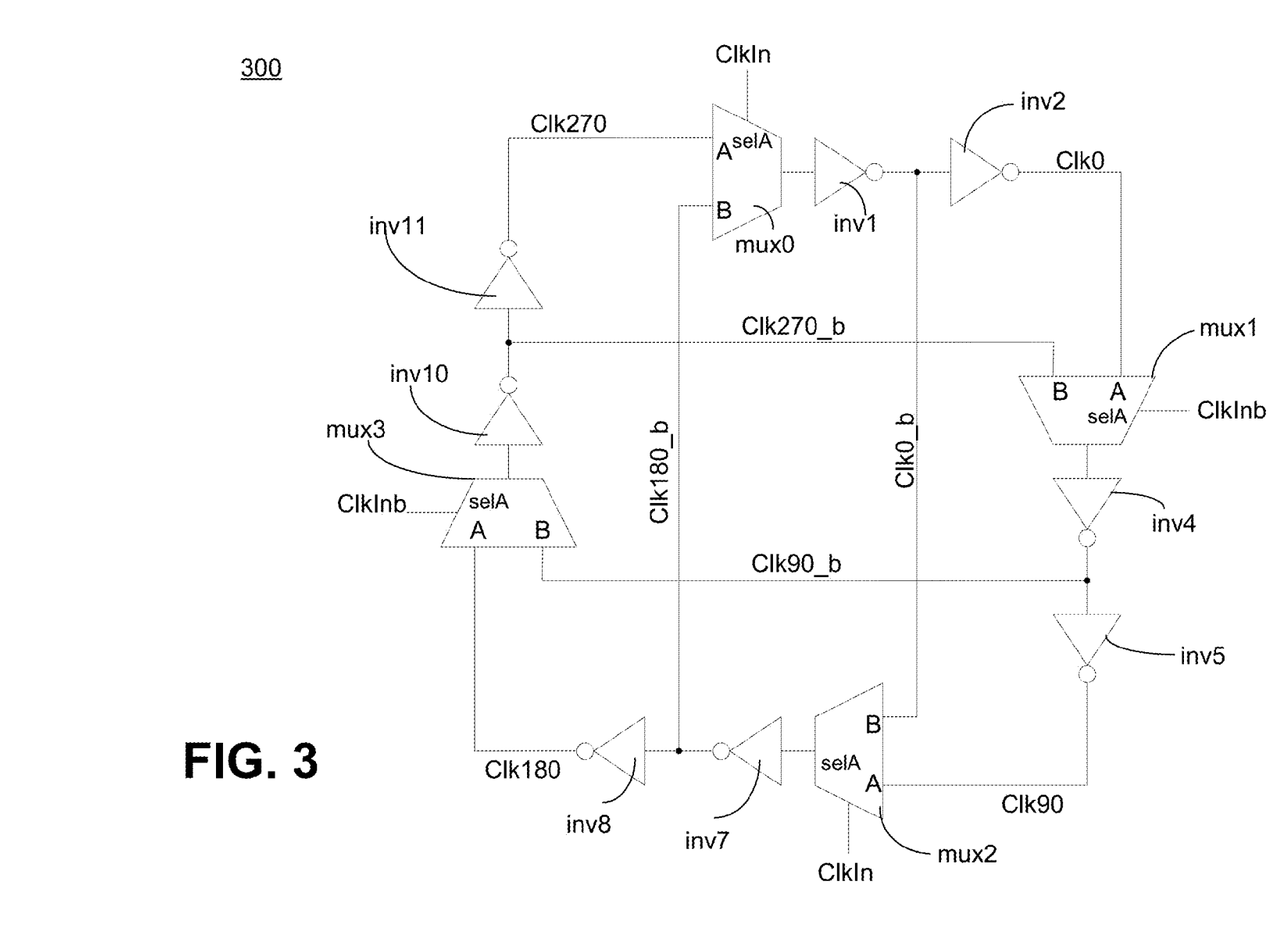
FIG. 3 illustrates a contention free circular quadrature clock generator, according to one embodiment of the disclosure.

FIG. 3 illustrates a contention free circular quadrature clock generator 300 (or quadrature divider 300), according to one embodiment of the disclosure. It is pointed out that those elements of FIG. 3 having the same reference numbers (or names) as the elements of any other figure can operate or function in any manner similar to that described, but are not limited to such. So as not to obscure the embodiments, generator 300 is described with reference to FIG. 2A.

Compared to the embodiment of FIG. 2A, quadrature generator 300 has fewer logic gates and eliminates the use of jam latches e.g., jam0 and jam1, according to one embodiment. In one embodiment, output of inv1 is directly input to input B of third multiplexer mux2 (also called third selection unit). In one embodiment, output of inv7 is directly input to input B of first multiplexer mux0 (also called first selection unit). In one embodiment, output of inv4 is directly input to input B of fourth multiplexer mux3 (also called fourth selection unit). In one embodiment, output of inv10 is directly input to input B of second multiplexer mux1 (also called second selection unit). In one embodiment, the multiplexers are implemented using pass-gates. In other embodiments, other circuits may be used to implement the selection units.

By removing the contention jam latches and extra inverters from quadrature generator 200, the embodiment of FIG. 3 achieves higher bandwidth and lower power consumption compared to quadrature generator 200. In this embodiment, ring topology is used to ensure complementary state generation with contention. In one embodiment, the retention loops of jam0 and jam1 are converted to cross-couplings (i.e., loop with Clk0_b and Clk180b, and loop with Clk90_b and Clk270b). In this embodiment, inv0, inv3, inv6, and inv9 are also removed. In the embodiment of FIG. 3, the load on nodes ClkIn and ClkInb remains the same as in FIG. 2A, but overall layout is smaller than that of generator of FIG. 2A.

Figure 4:
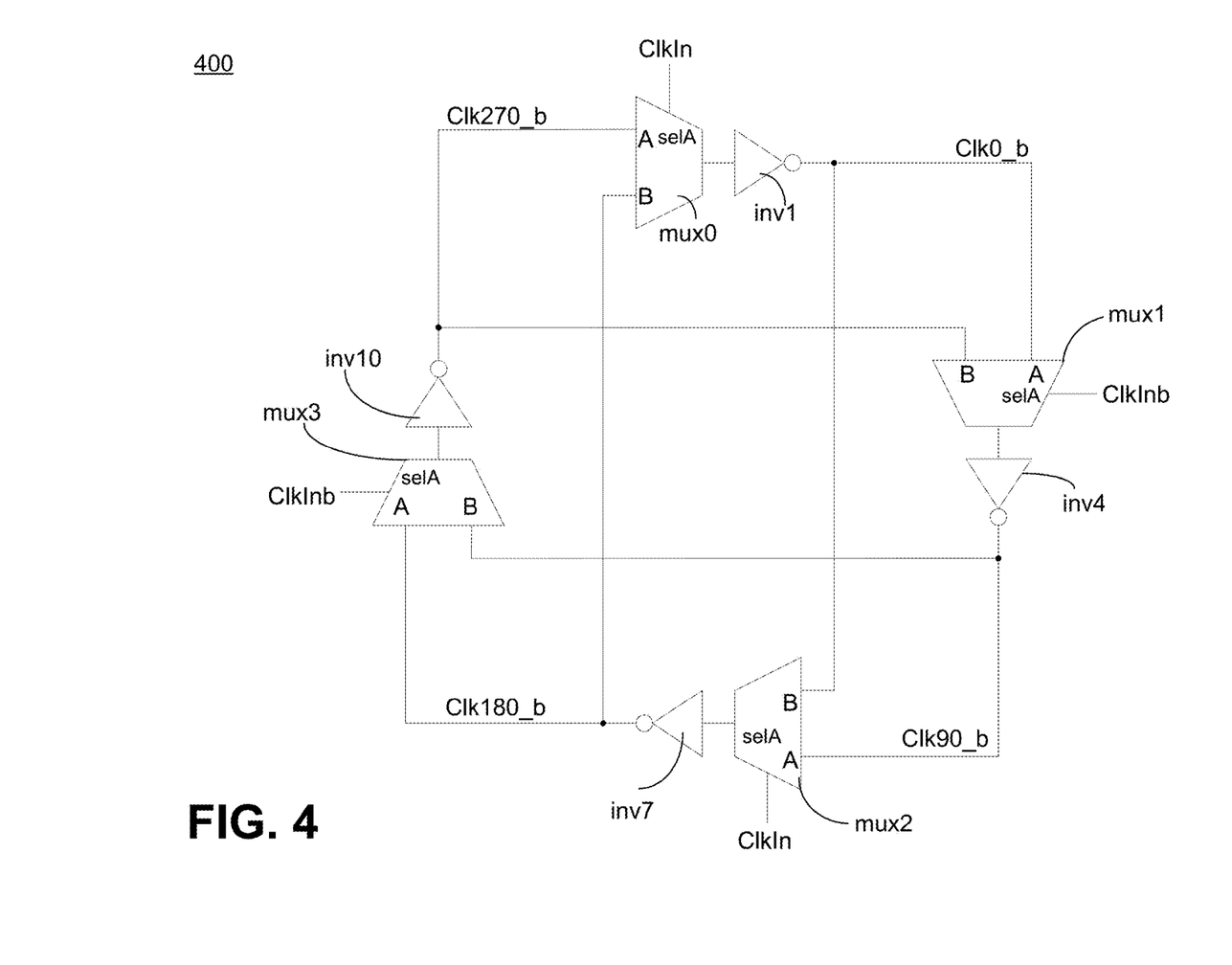
FIG. 4 illustrates another contention free circular quadrature clock generator, according to another embodiment of the disclosure.

FIG. 4 illustrates a contention free circular quadrature clock generator 400 (or quadrature divider 400), according to another embodiment of the disclosure. It is pointed out that those elements of FIG. 4 having the same reference numbers (or names) as the elements of any other figure can operate or function in any manner similar to that described, but are not limited to such. Embodiment of FIG. 4 is described with reference to FIGS. 2-3. So as not to obscure the embodiments, only major differences between FIG. 3 and FIG. 4 are described.

In one embodiment, inv2, inv5, inv8, and inv11 are removed. In one embodiment, inputs to first multiplexer mux0 are Clk270_b and Clk180_b. In one embodiment, inputs to second multiplexer mux1 are Clk270_b and Clk0_b. In one embodiment, inputs to third multiplexer mux2 are Clk0_b and Clk90_b. In one embodiment, inputs to fourth multiplexer mux3 are Clk90_b and Clk180_b.

In one embodiment, an inverter (not shown) is coupled to receive Clk0_b to generate Clk0 for use by another circuit. In one embodiment, an inverter (not shown) is coupled to receive Clk90_b to generate Clk90 for use by another circuit. In one embodiment, an inverter (not shown) is coupled to receive Clk180_b to generate Clk180 for use by another circuit. In one embodiment, an inverter (not shown) is coupled to receive Clk270_b to generate Clk270 for use by another circuit. In the embodiment of FIG. 4, the load on nodes ClkIn and ClkInb remains the same as in FIG. 2A and FIG. 3, but overall layout area may be smaller than that of generators of FIG. 2A and FIG. 3.

Figure 5:
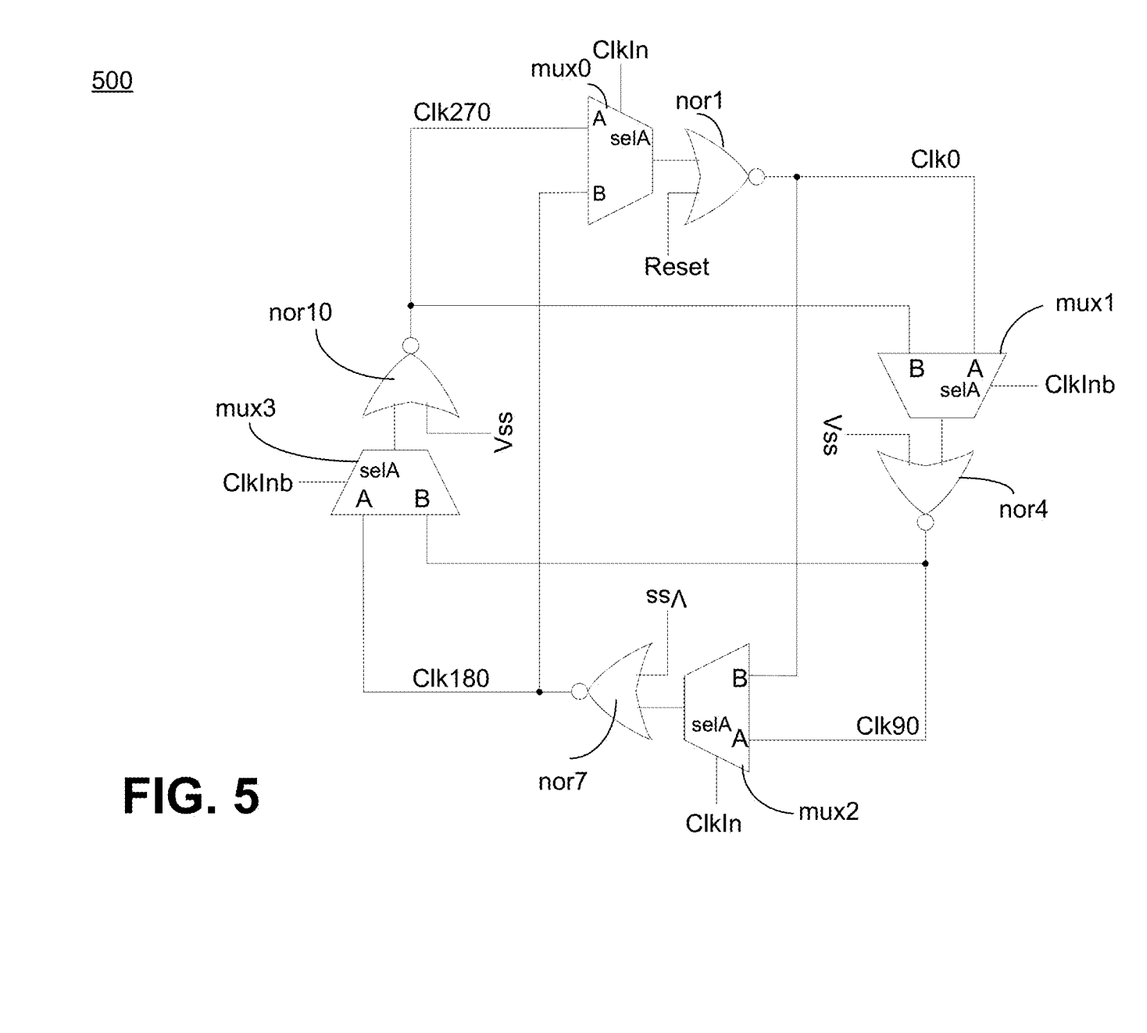
FIG. 5 illustrates a contention free circular quadrature clock generator with option to generate deterministic output, according to one embodiment of the disclosure.

FIG. 5 illustrates a contention free circular quadrature clock generator 500 (or quadrature divider 500) with option to generate deterministic output, according to one embodiment of the disclosure. It is pointed out that those elements of FIG. 5 having the same reference numbers (or names) as the elements of any other figure can operate or function in any manner similar to that described, but are not limited to such. So as not to obscure the embodiment of FIG. 5, elements previously discussed are not discussed again.

Some frequency dividers may want to park their outputs in a deterministic manner, preferably without compromising divider symmetry. In one embodiment, during parking, the differential input clocks remain complementary, avoiding rush-through oscillation in the N-P-N-P latch ring. Compared to the embodiment of FIG. 4, inverters inv1, inv4, inv7, and inv10 are replaced with logic gates.

In one embodiment, the logic gates are NOR gates. In one embodiment, inv1 is replaced with NOR gate nor1. In one embodiment, inv4 is replaced with NOR gate nor4. In one embodiment, inv7 is replaced with NOR gate nor7. In one embodiment, inv10 is replaced with NOR gate nor10. In one embodiment, one of the input of each NOR gate is the output of the multiplexer.

In one embodiment, one of the NOR gates receives a Reset signal as a second input. In this embodiment, nor1 receives the Reset signal while the second input of other NOR gates i.e., gates nor4, nor7, and nor10, is ground (i.e., Vss). In this embodiment, when Reset signal is asserted, Clk0 is forced to a logical low, which in turn causes Clk90 and Clk180 to become logical high, and Clk270 to become logical low. By causing Clk0, Clk90, Clk180, and Clk270 to be set to constant logical levels, divider 500 is parked. In one embodiment, when Reset is de-asserted, divider 500 continues to operate normally and generates quadrature clocks Clk0, Clk90, Clk180, and Clk270.

In one embodiment, the logic gates are NAND gates (not shown). In one embodiment, inv1 is replaced with NAND gate nand1. In one embodiment, inv4 is replaced with NAND gate nand4. In one embodiment, inv7 is replaced with NAND gate nand7. In one embodiment, inv10 is replaced with NAND gate nand10. In one embodiment, one of the inputs of each NAND gate is the output of the multiplexer.

In one embodiment, one of the NAND gates receives a ResetB signal as a second input, where ResetB signal is logical inverse of Reset signal. When Reset signal is asserted, ResetB is de-asserted (i.e., becomes logical low). In this embodiment, nand1 receives the ResetB signal while the second input of the other NAND gates i.e., gates nand4, nand7, and nand10, is power supply (i.e., Vdd). In this embodiment, when ResetB signal is asserted, Clk0 is forced to a logical high, which in turn causes Clk90 and Clk180 to become logical low, and Clk270 to become logical high. By causing Clk0, Clk90, Clk180, and Clk270 to be set to constant logical levels, divider 500 is parked. In one embodiment, when ResetB is de-asserted, divider 500 continues to operate normally and generates quadrature clock signals Clk0, Clk90, Clk180, and Clk270.

In other embodiments, other logical gates e.g., OR, AND, etc., may be used instead of the NOR gates to park divider 500 upon a reset signal assertion or de-assertion.

Figure 6:
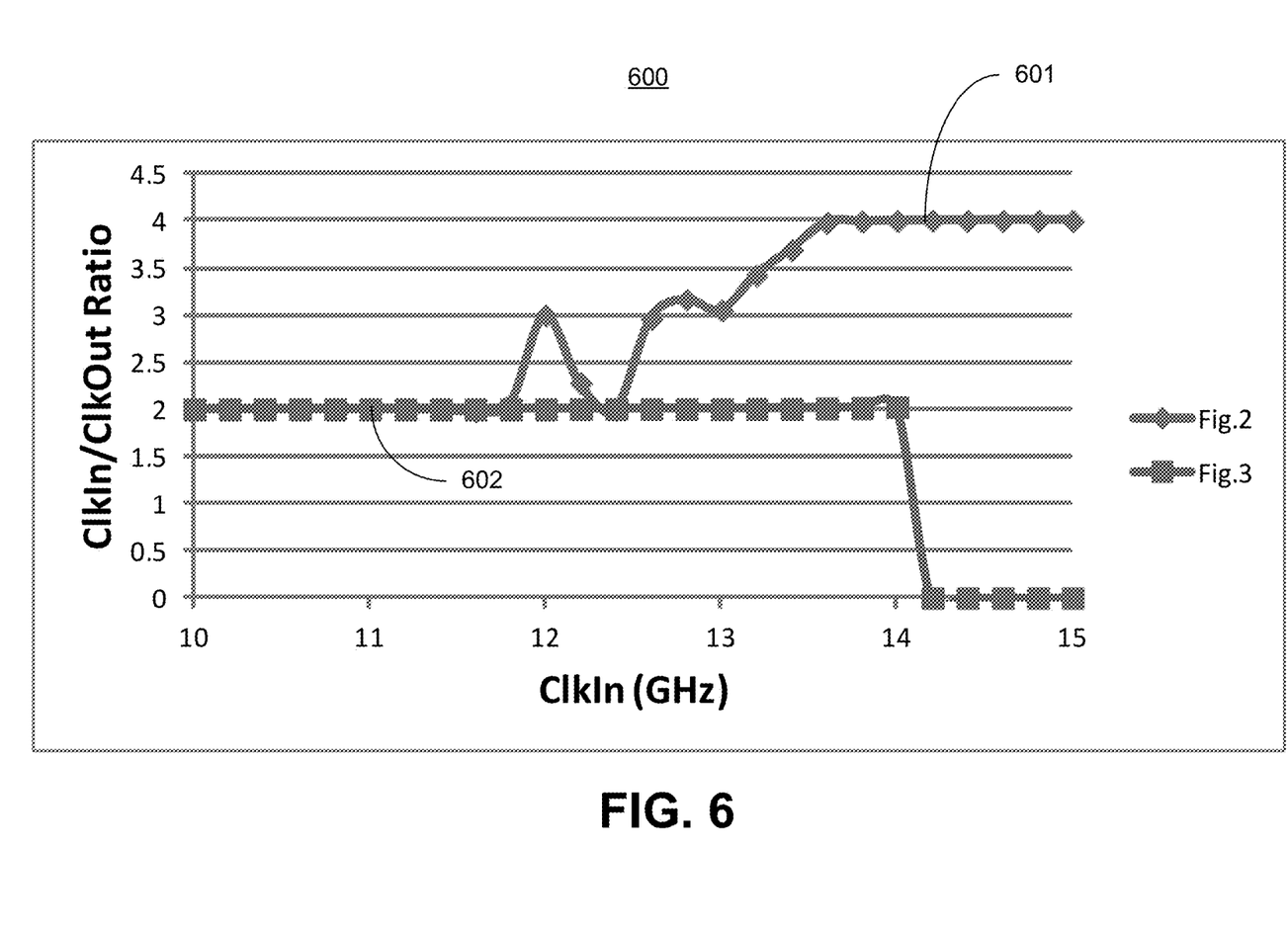
FIG. 6 illustrates a plot comparing bandwidth of a variation of circuit of FIG. 2 with jam latches relative to circuit of FIG. 4 which is independent of jam latches, according to another embodiment of the disclosure.

FIG. 6 illustrates a plot 600 comparing bandwidth of circuit of FIG. 2B with jam latches relative to circuit of FIG. 4 which is independent of jam latches, according to one embodiment. It is pointed out that those elements of FIG. 6 having the same reference numbers (or names) as the elements of any other figure can operate or function in any manner similar to that described, but are not limited to such.

Here, x-axis of plot 600 is frequency of ClkIn in GHz, and y-axis of plot 600 ratio of ClkIn/ClkOut. Waveform 601 is the maximum frequency of divider 200. Waveform 602 is the maximum frequency of divider 300. As the desired operation is frequency division by two, a point on the plot is considered functional if the Clkin/ClkOut ratio is 2.0. Waveform therefore 601 has a maximum functional frequency around 11.8 GHz while waveform 602 has a maximum functional frequency around 14.0 GHz.

Figure 7:
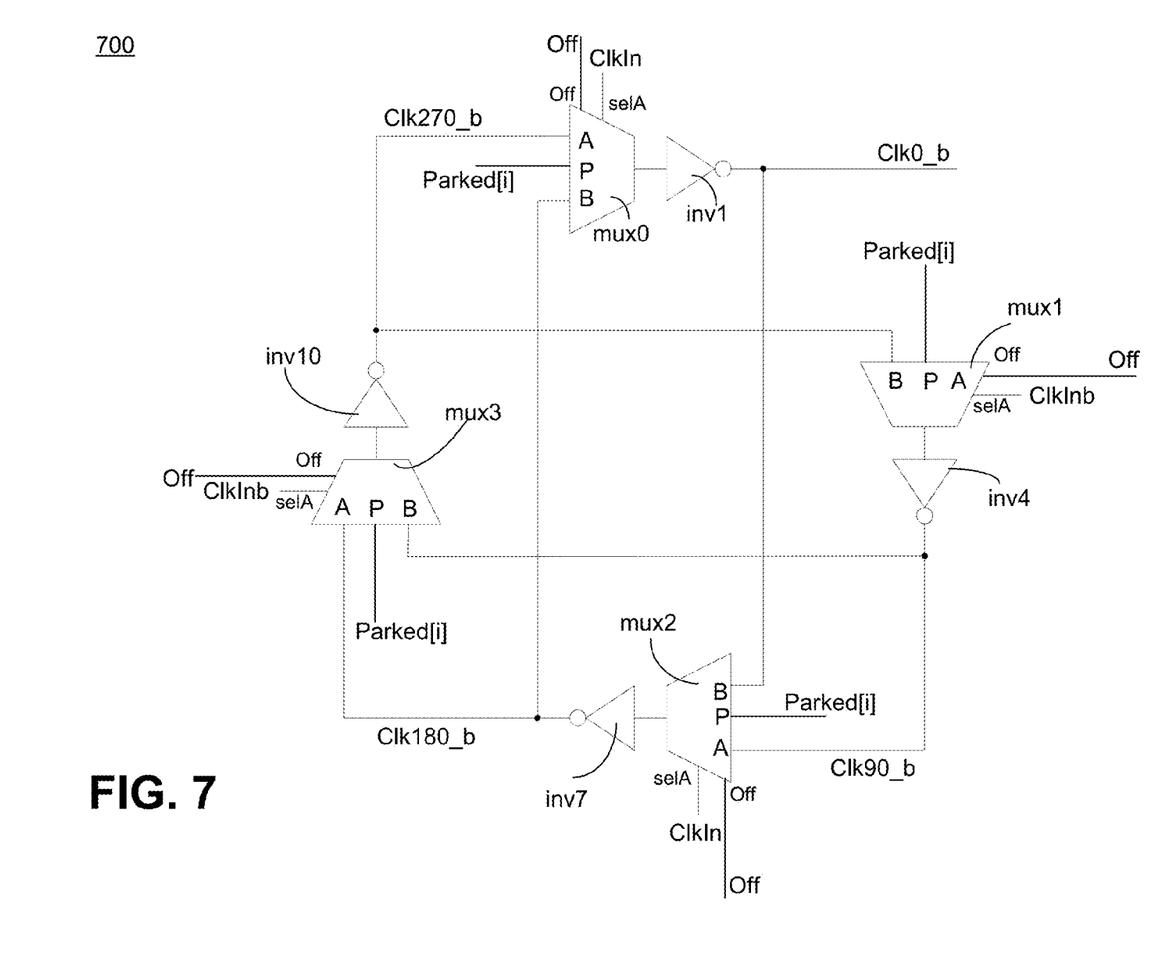
FIG. 7 illustrates another contention free circular quadrature clock generator with option to generate deterministic output, according to another embodiment of the disclosure.

FIG. 7 illustrates a contention free circular quadrature clock generator 700 with option to generate deterministic output, according to another embodiment of the disclosure. It is pointed out that those elements of FIG. 7 having the same reference numbers (or names) as the elements of any other figure can operate or function in any manner similar to that described, but are not limited to such. FIG. 7 is described with reference to FIG. 4 and FIG. 5. So as not to obscure the embodiment of FIG. 7, differences between the embodiment of FIG. 7 and embodiment of FIG. 4 are discussed.

In this embodiment, mux0, mux1, mux2, and mux3 are three input multiplexers compared to two input multiplexers of FIGS. 3-5. Being three input multiplexes, each multiplexer is controlled two select signal. Here, the two select signals are SelA and Off, where SelA is coupled to a clock signal (either ClkIn or ClkInb). In one embodiment, when Off signal is asserted (which is received by input Off of the multiplexers), Clk0_$b$, Clk90_$b$, Clk180_$b$, and Clk270_$b$ are parked to deterministic values. In one embodiment, the third input of the multiplexers is a vector of Parked[i] signals (where 'i' is an integer) which are used to establish the parking states of Clk0_$b$, Clk90_$b$, Clk180_$b$, and Clk270_$b$ as desired.

Figure 8:
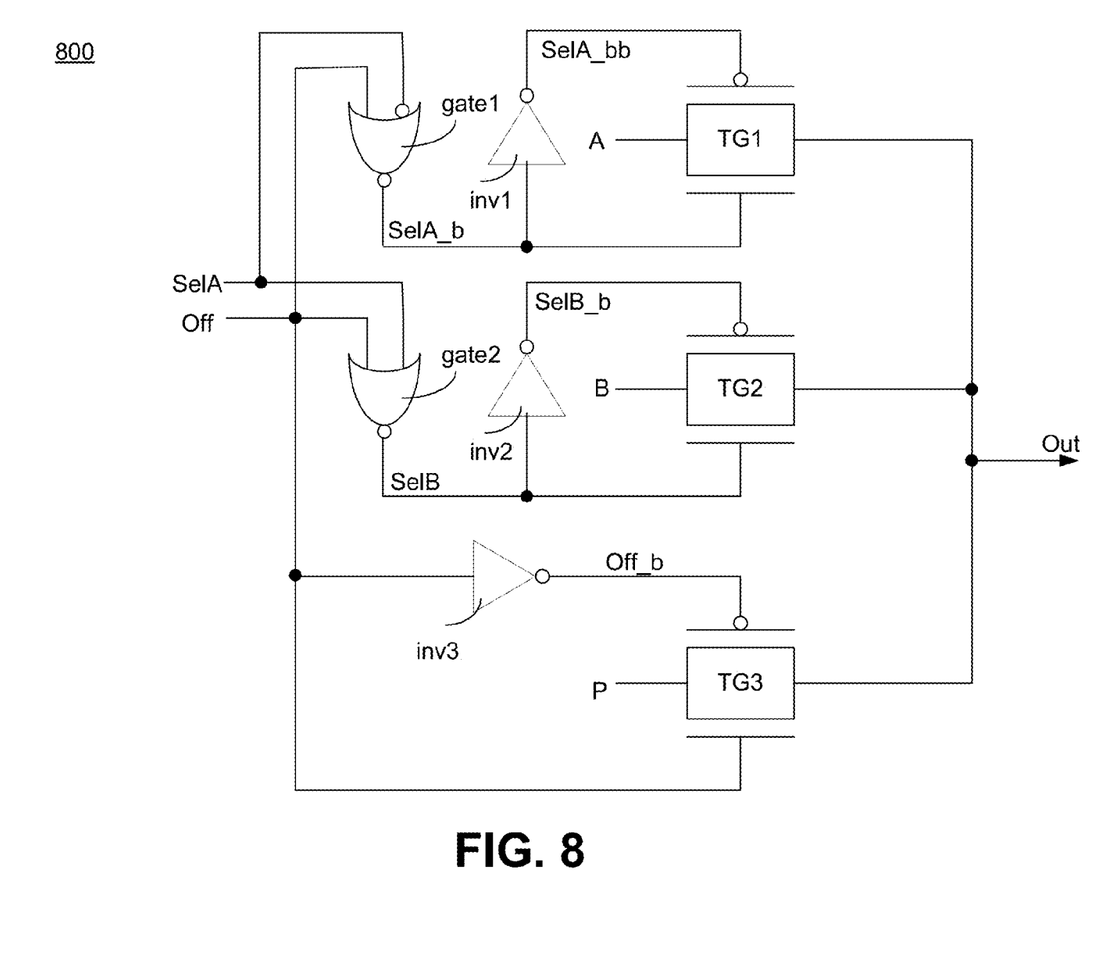
FIG. 8 is a multiplexer for use in the embodiment of FIG. 7, according to another embodiment of the disclosure.

FIG. 8 is a multiplexer 800 for use in the embodiment of FIG. 7, according to one embodiment. It is pointed out that those elements of FIG. 8 having the same reference numbers (or names) as the elements of any other figure can operate or function in any manner similar to that described, but are not limited to such.

In one embodiment, multiplexer 800 comprises transmission gates TG1, TG2, and TG3, logical gates (e.g., NOR gate) gate1 and gate2, and inverters inv1, inv2, and inv3. The three inputs to multiplexer are A, B, P, and the control signals are Off and SelA. In this embodiment, 'P' is coupled to one of the bits of Parked[i]. In one embodiment, Off signal (also referred as input Off) and inverted version of SelA signal are received by gate1 to generate SelA_bb signal. In one embodiment, inv1 receives SelA_b signal and generates SelA_bb signal. In one embodiment, SelA_b is used to control n-type transistor of TG1 and SelA_bb is used to control p-type transistor of TG1.

In one embodiment, Off signal (also referred as input Off) and SelA signal are received by gate2 to generate SelB signal. In one embodiment, SelB is received by inverter inv2 to generate SelB_b signal which is used to control p-type transistor of TG2 while SelB is used to control n-type transistor of TG2.

In one embodiment, input A is received at input of TG1. In one embodiment, input B is received by TG2. In one embodiment, input P is received by TG3. In one embodiment, inverter inv3 generates Off_b by inverting Off signal. In one embodiment, Off_b signal is used to control p-type transistor of TG3 while Off signal is used to control n-type transistor TG1.

The embodiments here can be used for any circuit that needs a quadrature divider. For example, an LC-Phase Locked Loop (PLL) or other PLLs. The embodiments are not limited to a quadrature divider. The concept of the embodiments can also be extended to divide-by-6, divide-by-8, etc., dividers.

Figure 9:
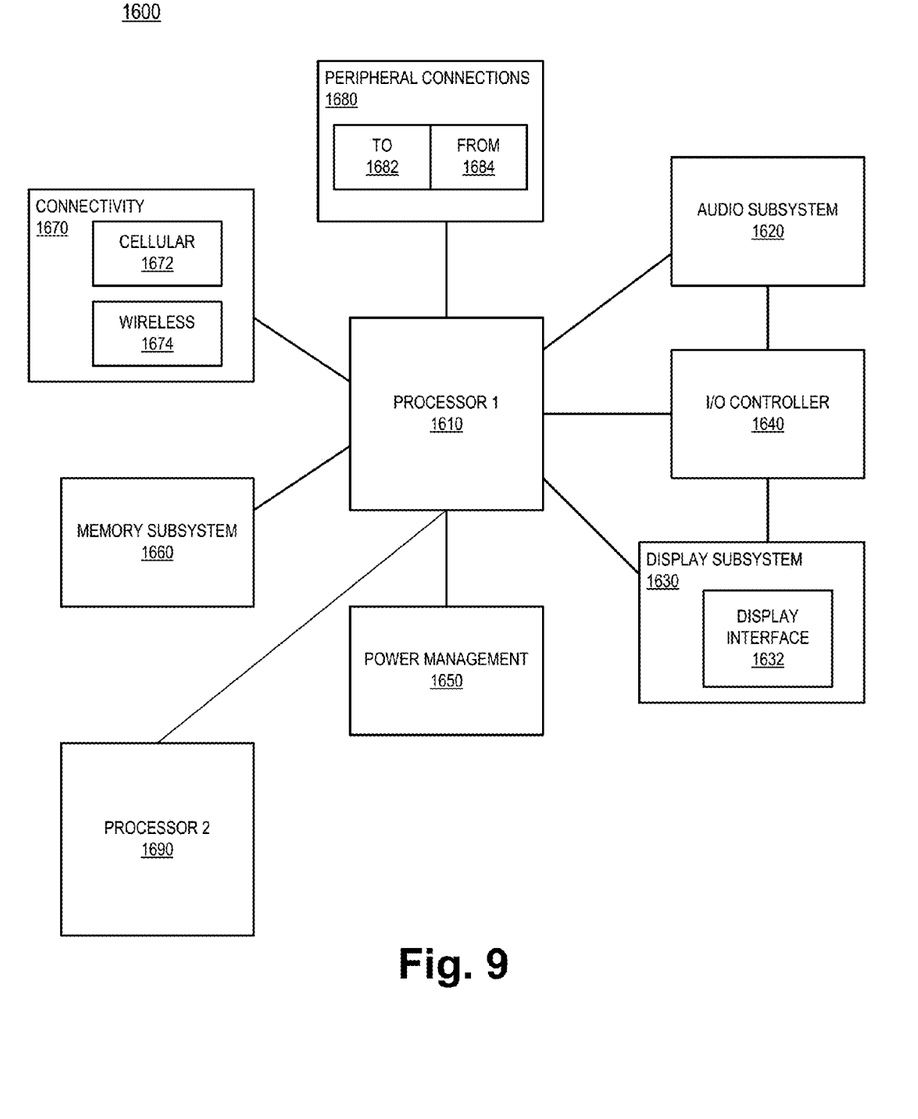
FIG. 9 is a smart device or a computer system or a SoC (system-on-chip) with a contention free circular quadrature clock generator, according to one embodiment of the disclosure.

FIG. 9 is a smart device or a computer system 1600 or an SoC (system-on-chip) with a contention free circular quadrature clock generator, according to one embodiment of the disclosure. FIG. 9 is a smart device or a computer system 1600 or an SoC (system-on-chip) with a contention free circular quadrature clock generator, according to one embodiment of the disclosure. It is pointed out that those elements of FIG. 9 having the same reference numbers (or names) as the elements of any other figure can operate or function in any manner similar to that described, but are not limited to such.

FIG. 9 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with a contention free circular quadrature clock generator, according to the embodiments discussed. Other blocks of the computing device 1600 may also include a contention free circular quadrature clock generator of the embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and/or processor 1690) can include one or more physical devices, such as microprocessors, application processors, microcontrollers, programmable logic devices, or other processing means. In one embodiment, processor 1690 is optional. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus independent of a jam latch for generating a quadrature clock is provided. In one embodiment, the apparatus comprises: a first selection unit controllable by a clock signal, the first selection unit to directly or indirectly generate a first phase of the quadrature clock; and a third selection unit controllable by the clock signal, the third selection unit to receive the first phase of the quadrature clock, the third selection unit to directly or indirectly generate a third phase of the quadrature clock, wherein the first selection unit to receive the third phase of the quadrature clock.

In one embodiment, the apparatus further comprises: a second selection unit controllable by an inverse of the clock signal, the second selection unit to receive the first phase of the quadrature clock, the second selection unit to directly or indirectly generate a second phase of the quadrature clock. In one embodiment, the third selection unit to receive the second phase of the quadrature clock. In one embodiment, the apparatus further comprises: a fourth selection unit controllable by the inverse of the clock signal, the fourth selection unit to receive the third phase of the quadrature clock, the fourth selection unit to directly or indirectly generate a fourth phase of the quadrature clock.

In one embodiment, the first selection unit to receive the fourth phase of the quadrature clock. In one embodiment, the second selection unit to receive the fourth phase of the quadrature clock. In one embodiment, the fourth selection unit to receive the second phase of the quadrature clock.

In another example, a system is provided which comprises: a memory; a processor coupled to the memory, the processor having the above; and a wireless interface for allowing the processor to communicate with another device.

In another example, an apparatus independent of a jam latch for generating a quadrature clock is provided. In this example, the apparatus comprises: a first selection unit controllable by a clock signal; a first logic gate coupled to the first selection unit, the first logic gate to receive a reset signal, the first logic gate to generate first phase of the quadrature clock; a third selection unit controllable by the clock signal, the third selection unit to receive the first phase of the quadrature clock; and a third logic gate coupled to the third selection unit, the third logic gate to receive a signal with a constant voltage level, the third selection unit to generate the third phase of the quadrature clock.

In one embodiment, the first selection unit to receive the third phase of the quadrature clock. In one embodiment, the first logic gate is one of a NOR gate or NAND gate. In one embodiment, the third logic gate is one of: a NOR logic gate and the signal with the constant voltage is a ground signal; or a NAND logic gate and the signal with the constant voltage is a power supply signal. In one embodiment, the apparatus further comprises: a second selection unit controllable by an inverse of the clock signal; and a second logic unit coupled to the second selection unit, the second logic unit to generate a second phase of the quadrature clock, the second logic gate to receive a signal with a constant voltage level.

In one embodiment, the second selection unit to receive the first phase of the quadrature clock. In one embodiment, the third selection unit to receive the second phase of the quadrature clock. In one embodiment, the third logic gate is one of: a NOR logic gate and the signal with the constant voltage is a ground signal; or a NAND logic gate and the signal with the constant voltage is a power supply signal. In one embodiment, the apparatus further comprises: a fourth selection unit controllable by the inverse of the clock signal; and a fourth logic unit coupled to the fourth selection unit, the fourth logic unit to generate a fourth phase of the quadrature clock, the fourth logic gate to receive a signal with a constant voltage level.

In one embodiment, the fourth selection unit to receive the third phase of the quadrature clock. In one embodiment, the first selection unit to receive the fourth phase of the quadrature clock. In one embodiment, the second selection unit to receive the fourth phase of the quadrature clock. In one embodiment, the fourth selection unit to receive the second phase of the quadrature clock. In one embodiment, the fourth logic gate is one of: a NOR logic gate and the signal with the constant voltage is a ground signal; or a NAND logic gate and the signal with the constant voltage is a power supply signal.

In another example, a system is provided which comprises: a memory; a processor coupled to the memory, the processor having the above; and a wireless interface for allowing the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus independent of a jam latch for generating a quadrature clock, the apparatus comprising:
   a first selection unit controllable by a clock signal, the first selection unit to generate a first phase of the quadrature clock; and a third selection unit controllable by the clock signal, the third selection unit to receive the first phase of the quadrature clock without a jam latch consisting of cross-coupled inverters arranged between the first selection unit and the third selection unit, the third selection unit to generate a third phase of the quadrature clock, wherein the first selection unit to receive the third phase of the quadrature clock.

2. The apparatus of claim 1 further comprises:
a second selection unit controllable by an inverse of the clock signal, the second selection unit to receive the first phase of the quadrature clock, the second selection unit to generate a second phase of the quadrature clock.

3. The apparatus of claim 2, wherein the third selection unit to receive the second phase of the quadrature clock.

4. The apparatus of claim 2 further comprises:
a fourth selection unit controllable by the inverse of the clock signal, the fourth selection unit to receive the third phase of the quadrature clock, the fourth selection unit to generate a fourth phase of the quadrature clock.

5. The apparatus of claim 4, wherein the first selection unit to receive the fourth phase of the quadrature clock.

6. The apparatus of claim 4, wherein the second selection unit to receive the fourth phase of the quadrature clock.

7. The apparatus of claim 4, wherein the fourth selection unit to receive the second phase of the quadrature clock.

8. The apparatus of claim 1, wherein the first selection unit and the third selection unit form a ring topology to ensure complementary state generation with contention.

9. The apparatus of claim 1, wherein the quadrature clock has a maximum functional frequency of 14 GHz.

10. A system comprising:
a memory;
a processor coupled to the memory, the processor having an apparatus independent of a jam latch for generating a quadrature clock comprising:
a first selection unit controllable by a clock signal, the first selection unit to directly or indirectly generate a first phase of the quadrature clock; and
a third selection unit controllable by the clock signal, the third selection unit to receive the first phase of the quadrature clock without a jam latch consisting of cross-coupled inverters arranged between the first selection unit and the third selection unit, the third selection unit to generate a third phase of the quadrature clock,
wherein the first selection unit to receive the third phase of the quadrature clock; and
a wireless interface for allowing the processor to communicate with another device.

11. The system of claim 10, wherein the first selection unit and the third selection unit form a ring topology to ensure complementary state generation with contention.

12. The system of claim 10, wherein the quadrature clock has a maximum functional frequency of 14 GHz.

* * * * *